United States Patent
Cui et al.

(10) Patent No.: US 12,407,301 B2
(45) Date of Patent: Sep. 2, 2025

(54) MULTI-BAND LOW NOISE AMPLIFIER, PHASED ARRAY, AND ELECTRONIC DEVICE

(71) Applicant: Huawei Technologies Co., Ltd., Shenzhen (CN)

(72) Inventors: Keji Cui, Shenzhen (CN); Di Li, Shenzhen (CN); Yongchang Yu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 50 days.

(21) Appl. No.: 18/321,090

(22) Filed: May 22, 2023

(65) Prior Publication Data

US 2024/0396504 A1 Nov. 28, 2024

Related U.S. Application Data

(63) Continuation of application No. PCT/CN2020/130721, filed on Nov. 23, 2020.

(51) Int. Cl.
| | |
|---|---|
| *H03F 1/26* | (2006.01) |
| *H01Q 1/24* | (2006.01) |
| *H01Q 5/335* | (2015.01) |
| *H03F 1/56* | (2006.01) |
| *H03F 3/24* | (2006.01) |

(52) U.S. Cl.
CPC ............ *H03F 1/26* (2013.01); *H01Q 1/246* (2013.01); *H01Q 5/335* (2015.01); *H03F 1/56* (2013.01); *H03F 3/245* (2013.01); *H03F 2200/222* (2013.01); *H03F 2200/294* (2013.01); *H03F 2200/336* (2013.01); *H03F 2200/451* (2013.01)

(58) Field of Classification Search
CPC .......... H01Q 1/246; H01Q 5/335; H03F 1/26; H03F 1/56; H03F 3/245; H03F 2200/222; H03F 2200/294; H03F 2200/336; H03F 2200/451

See application file for complete search history.

(56) References Cited

U.S. PATENT DOCUMENTS

| | | | |
|---|---|---|---|
| 2008/0129410 A1* | 6/2008 | Fukuda | ................ H03F 1/0288 330/53 |
| 2020/0366325 A1 | 11/2020 | Medra et al. | |

FOREIGN PATENT DOCUMENTS

| | | |
|---|---|---|
| CN | 101027846 A | 8/2007 |
| CN | 109921819 A | 6/2019 |
| CN | 110350926 A | 10/2019 |

* cited by examiner

*Primary Examiner* — Jimmy T Vu
(74) *Attorney, Agent, or Firm* — Slater Matsil, LLP

(57) ABSTRACT

This application provides a multi-band low noise amplifier, including: an input end, a first input matching network, a second input matching network, a first amplifier, and a second amplifier. The input end is coupled to an antenna and is configured to receive an inter-band carrier aggregation signal, where the inter-band carrier aggregation signal includes a first carrier signal located in a first band and a second carrier signal located in a second band, and the first band is different from and does not overlap the second band. The first input matching network is coupled between the input end and the first amplifier and is configured to perform impedance matching for the first carrier signal. The second input matching network is coupled between the input end and the second amplifier and is configured to perform impedance matching for the second carrier signal.

20 Claims, 6 Drawing Sheets

MULTI-BAND LOW NOISE AMPLIFIER, PHASED ARRAY, AND ELECTRONIC DEVICE

CROSS-REFERENCE TO RELATED APPLICATIONS

This application is a continuation of International Application No. PCT/CN2020/130721, filed on Nov. 23, 2020, the disclosure of which is hereby incorporated by reference in its entirety.

TECHNICAL FIELD

This application relates to the field of wireless communication, and in particular, to a multi-band low noise amplifier, a phased array, and an electronic device.

BACKGROUND

Due to limited frequency resources in low bands, development of wireless communication toward high bands becomes an inevitable trend. For example, millimeter wave bands with abundant spectrum resources have been extensively studied. As the frequency increases, a higher path loss is caused, limiting the development of wireless communication. A phased array technology provides a possible solution. In a high-band communication field of 5G new radio (NR), a vehicle-mounted radar field, and related technical fields, a phased array technology has become a mandatory technical means. To make full use of frequency resources, a phased array supporting multiple bands has also gradually become an important technical trend. A multi-band phased array in a conventional technology generally uses a combination of multiple single-band receivers, inevitably leading to an excessively large area.

SUMMARY

Embodiments of this application provide a multi-band low noise amplifier, a phased array, and an electronic device, to implement miniaturized multi-band signal receiving.

To achieve the foregoing objectives, the following technical solutions are used in embodiments of this application.

According to a first aspect, a multi-band phased array is provided, including a plurality of branches coupled to a plurality of multi-band antennas. Each of the plurality of branches includes a multi-band low noise amplifier. The multi-band low noise amplifier is configured to receive an inter-band carrier aggregation signal, where the inter-band carrier aggregation signal includes a first carrier signal located in a first band and a second carrier signal located in a second band, and the first band is different from and does not overlap the second band. The multi-band low noise amplifier includes an input end, a first input matching network, a second input matching network, a first amplifier, and a second amplifier. The input end is coupled to the multi-band antenna, and is configured to receive the inter-band carrier aggregation signal. The first input matching network is coupled between the input end and the first amplifier, and is configured to implement impedance matching for the first carrier signal. The first amplifier is configured to amplify a matched first carrier signal. The second input matching network is coupled between the input end and the second amplifier, and is configured to implement impedance matching for the second carrier signal. The second amplifier is configured to amplify a matched second carrier signal. Each of the plurality of branches further includes a phase shifter. The phase shifter is configured to perform phase shifting on the first carrier signal output by an output end of the first amplifier. The phase shifter is further configured to perform phase shifting on the second carrier signal output by an output end of the second amplifier. Based on this architecture, a miniaturized phased array with an inter-band carrier aggregation function can be achieved.

In a possible implementation, the first matching network is further configured to suppress transmission of the second carrier signal, and the second matching network is further configured to suppress transmission of the first carrier signal. Based on the foregoing design of the matching networks, the multi-band low noise amplifier can have better anti-interference performance.

In a possible implementation, a center frequency of the first band is lower than a center frequency of the second band. The first matching network includes a first inductor. The first inductor is coupled in series between an input end and an output end of the first matching network. The second matching network includes a transformer. The transformer is coupled between an input end and an output end of the second matching network. The transformer includes a primary coil and a secondary coil. One end of the primary coil is coupled to the input end of the second matching network, and another end of the primary coil is coupled to ground. One end of the secondary coil is coupled to the output end of the second matching network, and another end of the secondary coil is coupled to ground. Based on the foregoing design of the matching networks, a matching network having both matching and anti-interference performance can be achieved at low costs, and ESD performance can be improved.

In a possible implementation, the first matching network further includes a grounding switch coupled between a signal path and a ground end. Based on the introduction of the grounding switch, a capability of the first matching network to suppress a signal in the second band is further improved.

In a possible implementation, the multi-band low noise amplifier further includes a second inductor, where one end of the second inductor is coupled to the input end, and another end of the second inductor is coupled to ground. This can further improve matching performance of an amplification circuit and improve the ESD performance.

In a possible implementation, the first amplifier includes a first source degeneration inductor, and the second amplifier includes a second source degeneration inductor; and an inductance value of the first source degeneration inductor is greater than that of the second source degeneration inductor. With the use of the source-degeneration structure, an out-of-band rejection function can be further integrated into the amplification circuit, to improve suppression of the second carrier by the first amplifier and suppression of the first carrier by the second amplifier, and improve an anti-interference capability of the amplification circuit.

In a possible implementation, the antenna is a multi-band single-feed antenna, and is coupled to the input end by a feed point. This can further save an area and reduce a difficulty in designing a feeder.

In a possible implementation, the phase shifter includes a first phase shift branch and a second phase shift branch. The first phase shift branch is coupled to the output end of the first amplifier, and is configured to perform phase shifting on the first carrier signal. The second phase shift branch is coupled to the output end of the second amplifier, and is configured to perform phase shifting on the second carrier signal. The use of the foregoing different phase shift branches based on different bands reduces a difficulty in designing the phase shifter, and achieves cost and function optimization.

In a possible implementation, the first phase shift branch includes a first mixer and a first phase shift unit, and the second phase shift branch includes a second mixer and a second phase shift unit. The first phase shift unit is coupled between the first mixer and a local oscillator signal generator, and the second phase shift unit is coupled between the second mixer and the local oscillator signal generator. The use of the foregoing local oscillator phase shift architecture simplifies design of a multi-band phase shifter.

In a possible implementation, the local oscillator signal generator includes a first local oscillator signal generator and a second local oscillator signal generator. The first phase shift unit is coupled between the first local oscillator signal generator and the first mixer. The second phase shift unit is coupled between the second local oscillator signal generator and the second mixer. The use of different local oscillator signal generators expands a frequency coverage range of local oscillator signals and reduces a design difficulty.

In a possible implementation, the first phase shift branch includes a third phase shift unit, and the third phase shift unit is coupled between the first mixer and an intermediate frequency signal processor, and is configured to perform phase shifting on a down-converted intermediate frequency signal in the first phase shift branch; the second phase shift branch includes a fourth phase shift unit, and the fourth phase shift unit is coupled between the second mixer and the intermediate frequency signal processor, and is configured to perform phase shifting on a down-converted intermediate frequency signal in the second phase shift branch; and the intermediate frequency processor is configured to perform filtering and analog-to-digital conversion on the phase-shifted intermediate frequency signal. The use of the intermediate frequency phase shift architecture further optimizes the design of the phase shifter.

In a possible implementation, a selector is further included and is coupled between the antenna and the input end of the multi-band low noise amplifier. The phased array using this architecture can have a transmit/receive duplexing function.

In a possible implementation, the first band covers n257, n258, and n261, and the second band covers n259 and n260. Based on this phased array architecture, the foregoing frequency resources can be fully utilized more efficiently.

According to a second aspect, a multi-band low noise amplifier is provided, including an input end, a first input matching network, a second input matching network, a first amplifier, and a second amplifier. The input end is coupled to an antenna and is configured to receive an inter-band carrier aggregation signal, where the inter-band carrier aggregation signal includes a first carrier signal located in a first band and a second carrier signal located in a second band, and the first band is different from and does not overlap the second band. The first input matching network is coupled between the input end and the first amplifier, and is configured to perform impedance matching for the first carrier signal. The first amplifier is configured to output an amplified first carrier signal. The second input matching network is coupled between the input end and the second amplifier, and is configured to perform impedance matching for the second carrier signal. The second amplifier is configured to output an amplified second carrier signal. Based on the foregoing multi-band low noise amplifier, because the same input end is used to simultaneously receive inter-band carrier aggregation signals located in the first band and the second band, a design complexity of the multi-band low noise amplifier and the antenna is greatly reduced, and a circuit area is reduced.

It should be understood that the multi-band low noise amplifier according to the second aspect may further have other possible implementations. For details, refer to features of the multi-band low noise amplifier in the possible implementations of the first aspect. Details are not described herein again.

According to a third aspect, an electronic device is provided, including a transceiver, a memory, and a processor. The foregoing multi-band phased array is disposed in the transceiver.

DETAILED DESCRIPTION OF ILLUSTRATIVE EMBODIMENTS

Figure 1:
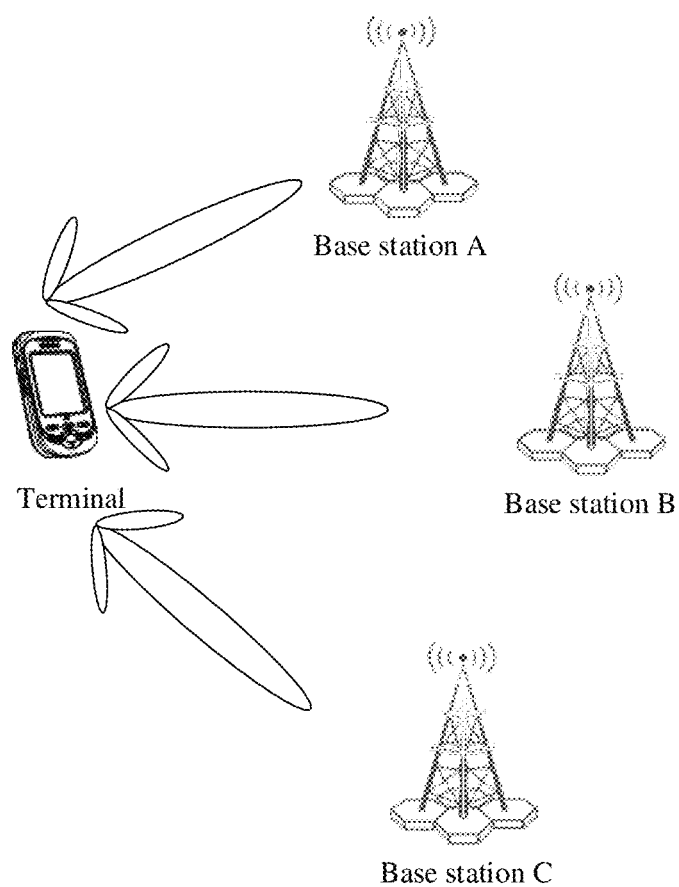
FIG. 1 is a schematic diagram of a structure of a wireless communication system according to an embodiment of this application.

The following describes technical solutions in embodiments of the present invention in detail with reference to the accompanying drawings. It is clear that the described embodiments are some rather than all of embodiments of the present invention. All other embodiments obtained by a person of ordinary skill in the art based on embodiments of the present invention without creative efforts shall fall within the protection scope of the present invention.

In a wireless communication system, devices may be classified into devices that provide a wireless network service and devices that use a wireless network service. The devices that provide the wireless network service are devices that form a wireless communication network, and may be briefly referred to as network devices (network equipment) or network elements. The network devices generally belong to operators (for example, China Mobile and Vodafone) or infrastructure providers (for example, China Tower), and are operated or maintained by these vendors. The network devices may further be classified into radio access network (RAN) devices and core network (CN) devices. Typical RAN devices include a base station (BS).

It should be understood that the base station sometimes may also be referred to as a wireless access point (AP) or a transmission reception point (TRP). Specifically, the base station may be a generation NodeB (gNB) in a 5G new radio (NR) system or an evolved NodeB (eNB) in a 4G long term evolution (LTE) system. Base stations may be classified into a macro base station and a micro base station based on different physical forms or transmit powers of the base stations. The micro base station sometimes is also referred to as a miniature base station or a small cell.

The devices that use the wireless network service are generally located on an edge of a network, and may be briefly referred to as terminals. A terminal can establish a connection to a network device, and provides a specific wireless communication service for a user based on a service of the network device. It should be understood that, because the terminal has a closer relationship with the user, the terminal sometimes is also referred to as a user equipment (UE) or a subscriber unit (SU). In addition, compared with a base station that is generally placed at a fixed location, the terminal usually moves along with the user, and sometimes is also referred to as a mobile station (MS). In addition, some network devices such as a relay node (relay node, RN) or a wireless router sometimes may also be considered as terminals because the network devices have a UE identity or belong to a user.

Specifically, the terminal may be a mobile phone, a tablet computer, a laptop computer, a wearable device (for example, a smart watch, a smart band, a smart helmet, or smart glasses), or other devices that have a wireless access capability, for example, an intelligent vehicle and various internet of things (IoT) devices including various smart home devices (such as a smart meter and a smart home appliance) and smart city devices (such as a security or monitoring device and an intelligent road transportation facility).

For ease of description, technical solutions in embodiments of this application are described in detail by using the base station and the terminal as examples in this application.

FIG. 1 is a schematic diagram of a structure of a wireless communication system according to an embodiment of this application. As shown in FIG. 1, the wireless communication system includes a terminal, a base station A, a base station B, and a base station C. The wireless communication system may comply with a third generation partnership project (3GPP) wireless communication standard, or may comply with another wireless communication standard, for example, an Institute of Electrical and Electronics Engineers (IEEE) 802 series (such as 802.11, 802.15, or 802.20) wireless communication standard.

Although FIG. 1 shows only three base stations and one terminal, the wireless communication system may alternatively include other quantities of terminals and base stations. In addition, the wireless communication system may further include another network device, for example, a core network device.

The terminal and the base station need to learn of configurations predefined by the wireless communication system, including a radio access technology (RAT) supported by the system and a radio resource configuration specified by the system, for example, a basic configuration of a radio band and a carrier. A carrier is a frequency range that complies with a specification of the system. The frequency range may be determined jointly based on a center frequency of the carrier (defined as a carrier frequency) and a bandwidth of the carrier. The configurations predefined by the system may be used as a part of a standard protocol for the wireless communication system, or may be determined through interaction between the terminal and the base station. Contents of a related standard protocol may be pre-stored in memories of the terminal and the base station, or embodied as hardware circuits or software code of the terminal and the base station.

In the wireless communication system, the terminal and the base station support the same RAT or RATs, for example, the 5G NR, or a RAT for a future evolutional system. Specifically, the terminal and the base station use the same air interface parameter, coding scheme, modulation scheme, and the like, and communicate with each other based on a radio resource specified by the system.

In FIG. 1, the terminal integrating a phased array may be directionally oriented to the base station A, the base station B, and the base station C respectively through different configurations. Compared with a conventional terminal, a terminal having a phased array function may implement a more centralized energy transmission by using the phased array function, thereby reducing a path loss of signal transmission at a high frequency range, especially in a millimeter wave frequency range, to some extent.

Figure 2:
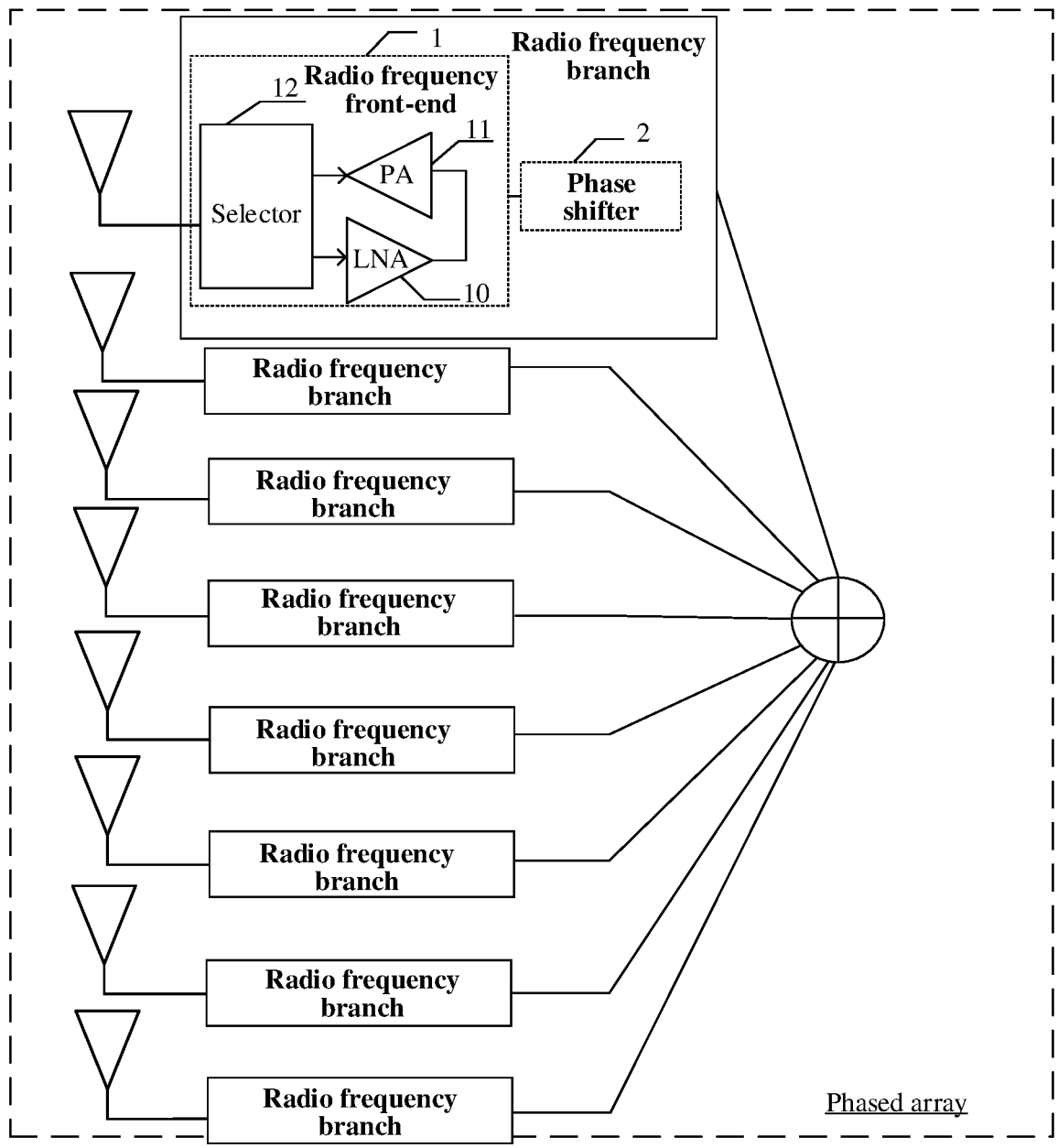
FIG. 2 is a schematic diagram of an architecture of a phased array transceiver according to an embodiment of this application.

FIG. 2 is a schematic diagram of an architecture of a phased array transceiver according to an embodiment of this application. A radio frequency phased array is used as an example. As shown in the figure, the phased array includes a plurality of radio frequency branches. Each of the plurality of radio frequency branches may include a corresponding radio frequency front-end 1 and a corresponding phase shifter 2. The radio frequency front-end 1 includes a low noise amplifier (LNA) 10 and a power amplifier (PA) 11. The low noise amplifier 10 is configured to amplify a received signal coupled from an antenna of the corresponding branch, and the power amplifier 11 is configured to amplify a transmit signal and output the amplified transmit signal to the antenna corresponding to the branch. Optionally, the phased array may be designed to have only one of receiving or transmitting functions, and correspondingly each branch may include only one of the low noise amplifier 10 and the power amplifier 11.

Further, each branch may further include a selector 12 configured to implement transmit/receive duplexing. When transmitting and receiving of the phased array are in different bands, the selector may be a duplexer configured to separate transmitted and received signals into different bands. When transmitting and receiving are in different slots, the selector may be a switch configured to enable or disable signal transmitting and signal receiving at different moments. Optionally, the selector 12 may be located at a front end of the branch, to be specific, coupled to an input end of the LNA and an output end of the PA, as shown in FIG. 2. The selector 12 may alternatively be located at a back end of the branch, to be specific, coupled to an output end of the LNA and an input end of the PA. The PA and the LNA are directly coupled to the antenna.

Each of the plurality of radio frequency branches of the phased array further includes the phase shifter to implement a phase shift function of the branch. For example, the phase shifter 2 is coupled to a back-end common node of the PA 11 and the LNA 10, to be specific, the output end of the LNA and the input end of the PA. Optionally, the phase shifter 2 may alternatively be coupled to the input end of the LNA and the output end of the PA. The PA and the LNA may share the phase shifter 2, but such an architecture that a same phase shifter is shared by transmitting and receiving is applicable only to a time division duplex mode. When the PA and the LNA operate in different bands at the same time, a separate phase shifter generally needs to be configured on a corresponding transmit path or receive path for each of the PA and the LNA.

Figure 3:
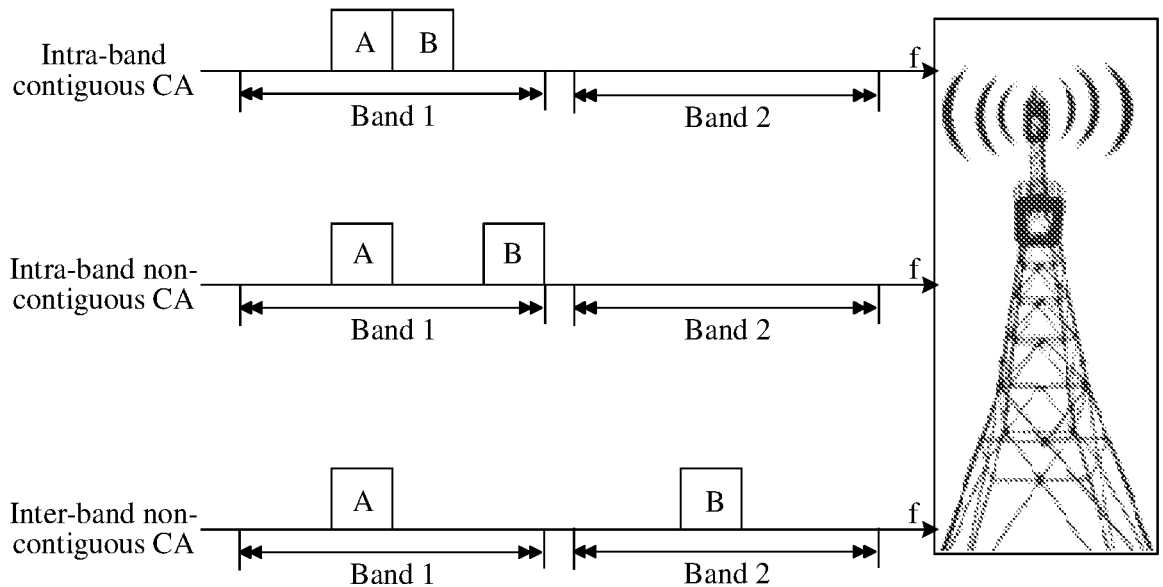
FIG. 3 is a schematic diagram of carrier aggregation according to an embodiment of this application.

In addition, to increase a communication bandwidth and achieve a higher user data throughput rate, a carrier aggregation (CA) technology has been used since 3GPP protocol R10 (Release 10). A principle of the CA technology is to carry user communication data on a plurality of carriers for communication. In the 3GPP protocol R10 (release 10), the following three CA application scenarios are defined, as shown in FIG. 3: intra-band contiguous CA; intra-band non-contiguous CA; and inter-band non-contiguous CA, or referred to as inter-band CA, where A and B represent two aggregated carriers, respectively. It should be understood that a quantity of carriers in carrier aggregation shown in FIG. 3 is not limited to two, and a larger quantity of carriers may be included. Using a millimeter-wave band as an example, a millimeter-wave band of 5G defined by 3GPP includes n257 (26.5 GHz to 29.500 GHz), n259 (39.5 GHz to 43.5 GHZ), n260 (37 GHz to 40 GHz), n258 (24.25 GHz to 27.5 GHZ), and n261 (27.5 GHz to 28.35 GHz). A band covering n257, n258, and n261 is generally referred to as a low band (LB), and a band covering n259 and n260 is generally referred to as a high band (HB). Carrier aggregation of an LB+HB combination involves different bands, and is also referred to as inter-band carrier aggregation or inter-band CA. For example, inter-band CA may include but is not limited to a plurality of combinations such as n257+n259, n257+n260, n258+n259, and n258+n260. It should be noted that, a specific frequency range of each millimeter wave band mentioned herein is merely an example, and may have another value in a specific implementation. This is not specifically limited in this application. It should be understood that technical solutions provided in this application are also applicable to other radio frequency bands.

A phased array integrating inter-band CA has advantages of both CA and a phased array to improve communication quality more efficiently. However, for a receiver, especially an LNA used in a phased array, it is a huge challenge to implement miniaturization while supporting inter-band CA of bands that are far from each other.

Figure 4:
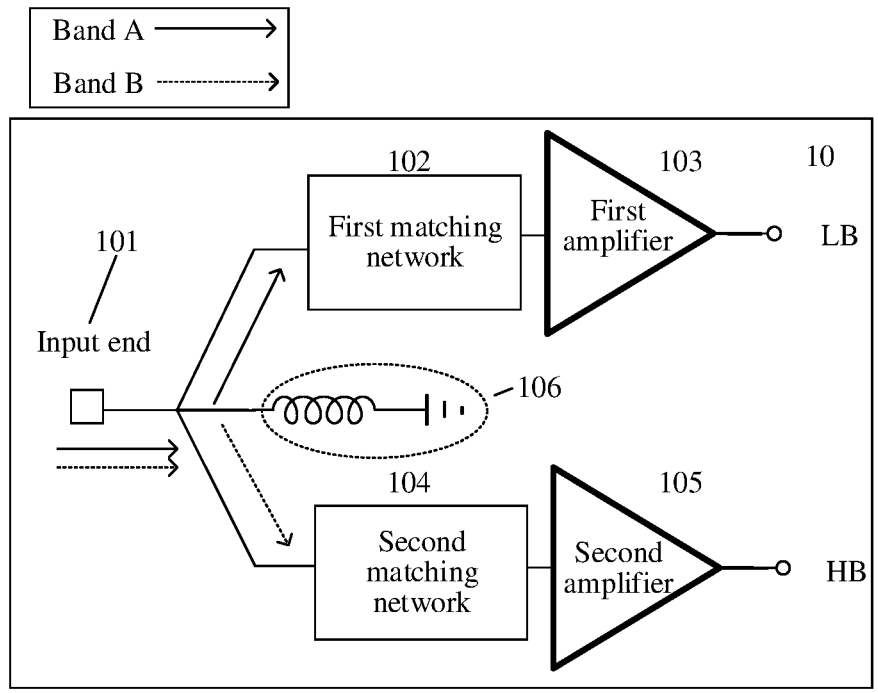
FIG. 4 is a schematic diagram of an architecture of a multi-band LNA supporting inter-band CA according to an embodiment of this application.

FIG. 4 is a schematic diagram of an architecture of a multi-band LNA supporting inter-band CA according to an embodiment of this application. On the basis of the foregoing embodiment, an LNA (10) may include an input end (101), a first matching network (102), a second matching network (104), a first amplifier (103), and a second amplifier (105). The input end (101) is coupled to an antenna, and is configured to receive an inter-band carrier aggregation signal, where the inter-band carrier aggregation signal may include a first carrier signal located in a first band and a second carrier signal located in a second band, and the first band is different from and does not overlap the second band.

Preferably, the antenna coupled to the input end is a multi-band single-feed antenna. In this way, the antenna may be coupled to the input end of the LNA by one feed point, thereby saving a system area. A selector 12 shown in FIG. 2 may be further included between the input end and the antenna, to further implement transmit/receive duplexing.

The first matching network (102) and the second matching network (104) are both coupled to the input end (101), and a signal in the first band and a signal in the second band are received through one input end. The first matching network (102) is coupled between the input end (101) and the first amplifier (103), and is configured to implement matching from the input end (101) to the first amplifier (103). The second matching network (104) is coupled between the input end (101) and the second amplifier (105), and is configured to implement matching from the input end (101) to the second amplifier (105). The first amplifier is configured to receive and amplify the signal in the first band, and the second amplifier is configured to receive and amplify the signal in the second band.

For example, a signal of inter-band CA formed by Band A+Band B is coupled to the input end (101). A signal of Band A enters the first amplifier 103 through the first matching network 102 and is amplified and then output, and a signal of Band B enters the second amplifier 105 through the second matching network 104 and is amplified and then output. Because the same input end is used to simultaneously receive the signal in the first band (Band A) and the signal in the second band (Band B), a design complexity between the LNA and a feeder of the antenna is greatly reduced, a quantity of pins of a circuit is reduced, and a circuit design area is also reduced.

However, the foregoing architecture also causes interference while reducing the area. Because the input end may simultaneously receive the signal in the first band (Band A) and the signal in the second band (Band B), the signal in the second band is also coupled to the first amplifier and output after being amplified, and the signal of the first band is also coupled to the second amplifier and output after being amplified, thereby causing extra interference in subsequent intermediate frequency signal processing and affecting performance.

Preferably, the first matching network may be designed to have a frequency-selective feature, to exhibit a matching feature for the signal in the first band and exhibit a suppression feature for the signal in the second band. Similarly, the second matching network may also be designed to have a frequency-selective feature, to exhibit a matching feature for the signal in the second band and exhibit a suppression feature for the signal in the first band. As shown in FIG. 4, when the first band is an LB and the second band is an HB, based on the first matching network and the second matching network that have the frequency-selective feature, the signal in the first band mainly passes through a first signal path formed by the first matching network and the first amplifier, and the signal in the second band mainly passes through a second signal path formed by the second matching network and the second amplifier. Therefore, the LNA may have better anti-interference performance. In addition to receiving the signal of inter-band CA, the LNA 10 may also support receiving of a single-band signal, and separately receive a signal in the first band or a signal in the second band in a time-division manner.

Figure 5:
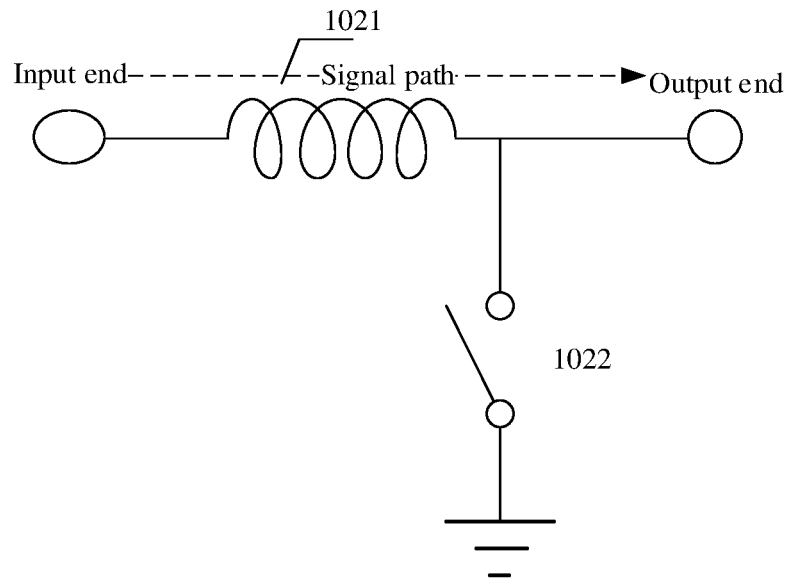
FIG. 5 is a schematic diagram of a low-frequency matching network according to an embodiment of this application.

For example, as shown in FIG. 5, the first matching network may include an inductor 1021 connected in series. The inductor 1021 is coupled in series between an input end and an output end of the first matching network. Because an equivalent impedance of the inductor is R=jwL, the equivalent impedance also increases as the frequency increases. In addition, due to a self-resonance feature of the inductor, the input end of the input matching network is used for impedance matching for the first band LB, and exhibits a suppression feature for the second band HB.

Optionally, the first matching network may further include a switch 1022 for grounding, which is coupled between a signal path and a ground end. Specifically, as shown in FIG. 5, the switch 1022 is coupled between the output end and the ground end. The switch 1022 is configured to be switched on when the LNA separately receives a signal in the second band, to further improve a capability of suppressing the signal in the second band. The switch 1022 is configured to be switched off when the LNA separately receives a signal in the first band, so as not to affect a path of the signal in the first band.

Optionally, the first matching network may also have other implementation forms, including but not limited to an L-shaped matching network and a PI-shaped matching network, which are not described one by one in this embodiment.

Figure 6:
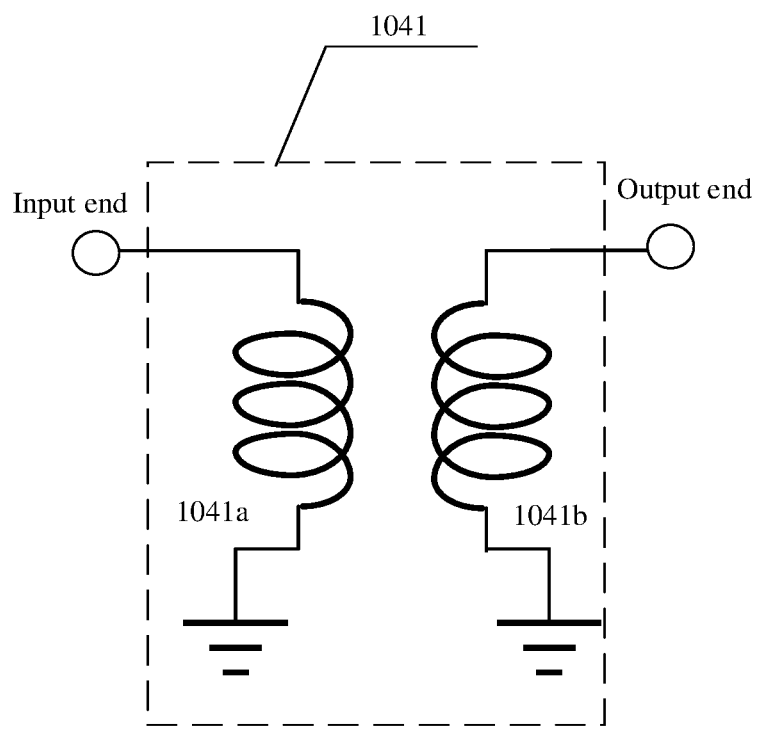
FIG. 6 is a schematic diagram of a high-frequency matching network according to an embodiment of this application.

For example, as shown in FIG. 6, the second matching network may include a transformer 1041, and the transformer is coupled between an input end and an output end of the second matching network. The transformer 1041 includes a primary coil 1041a and a secondary coil 1041b. One end of the primary coil 1041a is coupled to the input end of the second matching network, and another end of the primary coil 1041a is coupled to ground. One end of the secondary coil 1041b is coupled to the output end of the second matching network, and another end of the secondary coil 1041b is coupled to ground. The transformer 1041 resonates in an HB band, and forms a high impedance in an LB band, so that the input end of the second matching network exhibits a high impedance in the first band LB, and implements a matching feature in the second band HB. In addition, because the transformer 1041 is coupled to ground, electro-static discharge (ESD) performance of the input end 101 of the LNA 10 may be further improved.

Optionally, the second matching network may also have other implementation forms, including but not limited to an L-shaped matching network or a PI-shaped matching network, which are not described one by one in this embodiment.

Optionally, the LNA 10 shown in FIG. 4 may further include an inductor 106. One end of the inductor 106 is coupled to the input end 101, and another end of the inductor 104 is coupled to ground. The inductor 106 may be configured to improve the ESD performance of the LNA 10 and optimize a noise figure of the LNA.

The first amplifier 103 and the second amplifier 105 shown in FIG. 4 are respectively configured to amplify a signal in the LB band and a signal in the HB band, and use a typical existing amplifier architecture, such as a common-source or common-gate structure.

Figure 7:
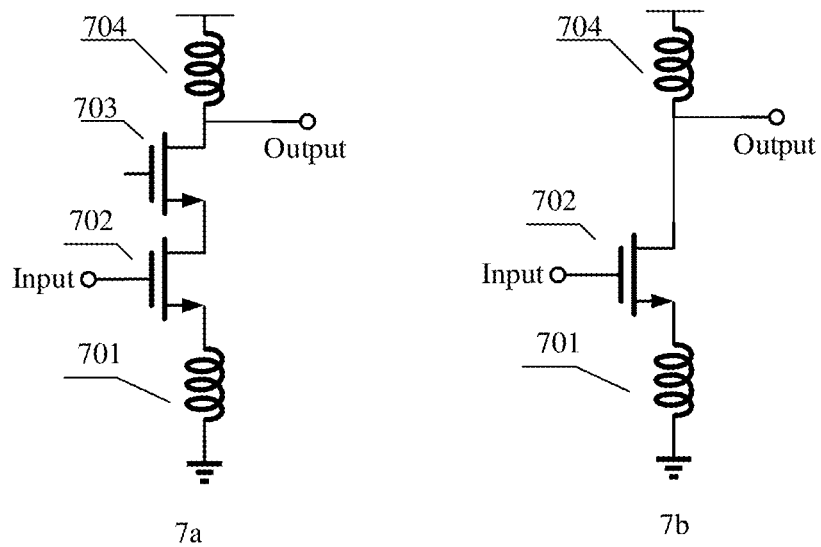
FIG. 7 is a schematic diagram of a source degeneration amplifier according to an embodiment of this application.

Further, to implement amplification of a signal in each band and suppress a signal out of the band to some extent, the amplifier may also use an architecture of a narrow-band low noise amplifier. For example, the amplifier may use an architecture of a source degeneration amplifier shown in FIG. 7, including but not limited to a cascode architecture with source degeneration shown in FIG. 7a and a common source architecture with source degeneration shown in FIG. 7b. Magnitude of a source degeneration inductor is related to a specific operating band of an amplifier. An inductance value of a source degeneration inductor used by the first amplifier for amplifying a signal in the LB band is greater than an inductance value of a source-degraded inductor used by the second amplifier for amplifying a signal in the HB band. Although an MOS transistor is used in FIG. 7, a BJT transistor may also be used. Specifically, the cascode architecture with source degeneration shown in FIG. 7b includes a first inductor 701, a first transistor 702, and a second inductor 704. A gate/base of the first transistor 702 is coupled to an input end of an amplifier, and a source/emitter of the first transistor 702 is coupled to ground through the first inductor 701. A drain/collector of the first transistor is coupled to the second inductor 704 and an output end of the amplifier, to output an amplified signal. On the basis of FIG. 7b, a second transistor 703 may be further included. The second transistor 703 is coupled between the first transistor and the second inductor 704 to form a cascode structure, that is, the architecture of the LNA shown in FIG. 7a. The MOS transistor shown in FIG. 7 includes but is not limited to an NMOS transistor, and may also be a combination of a PMOS transistor and an NMOS transistor.

In addition to being applied to the phased array architecture shown in FIG. 2, the architecture of the LNA shown in FIG. 4 may also be applied to an inter-band carrier aggregation single-channel transceiver. It should be understood that Band A and Band B shown in FIG. 4 are merely used as examples, and more carrier aggregation scenarios may be further included.

Figure 8:
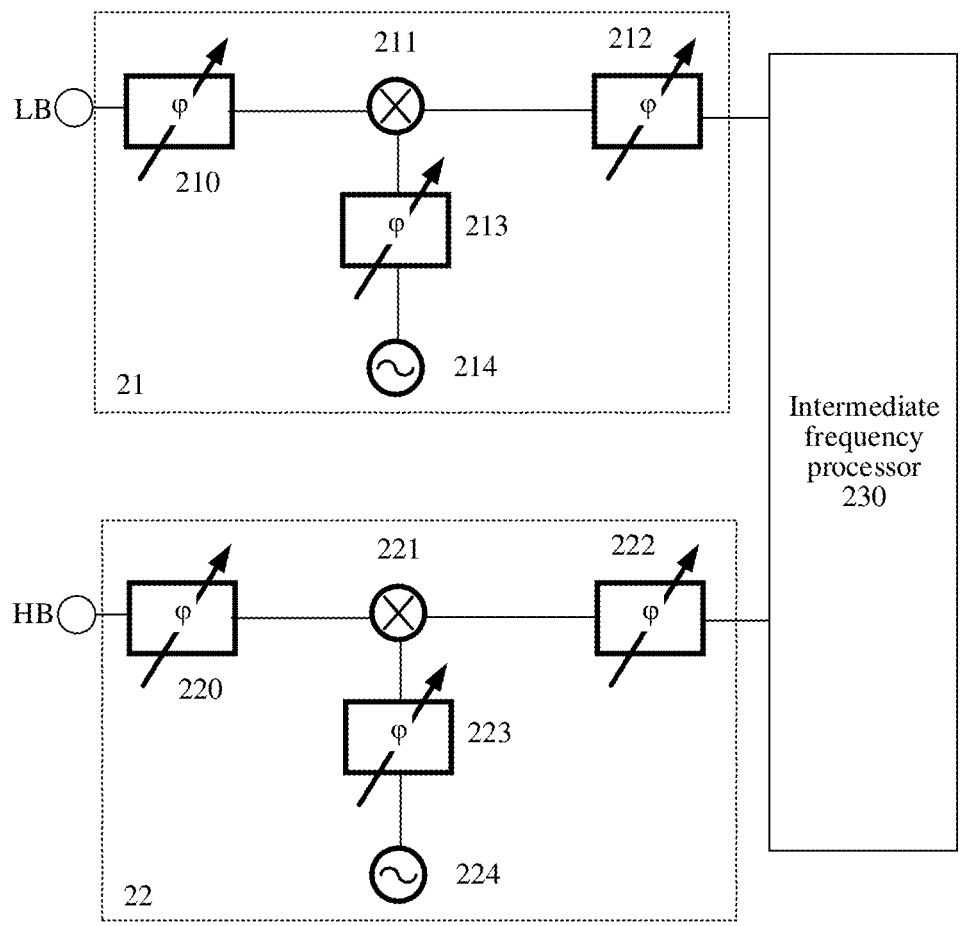
FIG. 8 is a schematic diagram of an architecture of a multi-band phased-array phase shifter according to an embodiment of this application.

FIG. 8 is a schematic diagram of an architecture of a multi-band phased array phase shifter according to an embodiment of this application. FIG. 8 includes a first phase shift branch 21 having an input end coupled to an LB and a second phase shift branch 22 having an input end coupled to an HB, to respectively perform phase shifting on carriers in different bands in the foregoing embodiments.

For example, the first phase shift branch 21 may include one or a combination of more than one of phase shift units 210, 213, and 212. Similarly, the second phase shift branch 22 may also include one or more of phase shift units 220, 223, and 222.

The input end of the first phase shift branch 21 may be coupled to an LB output end of the LNA in the foregoing embodiments, and the input end of the second phase shift branch 22 may be coupled to an HB output end of the LNA in the foregoing embodiments.

Optionally, the first phase shift branch 21 may include a first radio frequency phase shift unit 210 coupled between a first mixer 211 and the input end of the first phase shift branch 21. Similarly, the second phase shift branch 22 may also include a second radio frequency phase shift unit 220 coupled between a second mixer 221 and the input end of the second phase shift branch 22. The two phase shift units are respectively configured to perform phase shifting on radio frequency signals in the corresponding branches. Such phase shifting is referred to as radio frequency signal phase-shifting, and is a mainstream phase shifting manner currently.

Optionally, the first phase shift branch 21 may include a first local oscillator phase shift unit 213 coupled between the first mixer 211 and a first local oscillator 214. Similarly, the second phase shift branch 22 may also include a second local oscillator phase shift unit 223 coupled between the second mixer 221 and a second local oscillator 224. The two local oscillator phase shifters perform phase shifting on local oscillator signals before the local oscillator signals enter the corresponding mixers, to implement phase shifting for the corresponding branches. Such phase shifting is referred to as local oscillator signal phase shifting, and is more suitable for a wide-band signal than the former radio frequency signal phase shifting.

Optionally, the first phase shift branch 21 and the second phase shift branch 22 may share a same phase shift unit 213. The local oscillator signals generated by the local oscillator 214 and the local oscillator 224 pass through the same phase shift unit 213 in a time-division manner and then enter the corresponding mixers.

Optionally, on the basis of sharing the same phase shift unit 213, the first phase shift branch 21 and the second phase shift branch 22 may further share a same local oscillator. The oscillator is designed as a wide-band oscillator that outputs local oscillation signals in different bands in a time-division manner. The local oscillation signals enter the corresponding mixers through the same phase shift unit in a time-division manner.

Optionally, the first phase shift branch 21 may further include a first intermediate frequency phase shifter 212, and the intermediate frequency phase shifter 212 is coupled between the mixer 211 and an intermediate frequency signal processor 230 of the corresponding branch. The second phase shift branch 22 may further include a second intermediate frequency phase shifter 222, and the second intermediate frequency phase shifter 222 is coupled between the mixer 221 and an intermediate frequency signal processor 230 of the corresponding branch. The intermediate frequency signal processor 230 includes but is not limited to a filter and an analog-to-digital converter, and is configured to perform corresponding filtering and digital-to-analog conversion on a phase-shifted intermediate frequency signal. Such phase shifting is referred to as intermediate frequency signal phase shifting. Compared with the foregoing two phase shifting manners, such a phase shift architecture simplifies a design of combining and dividing a plurality of radio frequency branches in a phased array. Specifically, in processing of received signals, each radio frequency branch may perform intermediate frequency phase shifting on the received signals after mixing, and then perform combination.

Optionally, a multi-band phase shifter may use a combination of a plurality of phase shifting manners, including but not limited to a combination of radio frequency phase shifting and local oscillator phase shifting and a combination of local oscillator phase shifting and intermediate frequency phase shifting. Compared with radio frequency signal phase shifting, local oscillator signal phase shifting, and/or a combination thereof, the combination of intermediate frequency phase shifting and local oscillator phase shifting simplifies a design of a phase shifting circuit, and achieves a smaller circuit area and better performance.

Optionally, in different multi-band phase shifting scenarios, the multi-band phase shifter may include various combinations of the foregoing phase shift units, to make full use of advantages of one or a combination of the phase shift units.

Optionally, when local oscillator signal phase shifting is used, because each radio frequency branch in the phased array has a same operating frequency, each radio frequency branch may use a same local oscillator signal generator. After a local oscillator signal is phase-shifted by a local oscillator signal phase shift unit of the corresponding branch, the phase-shifted local oscillator signal is provided to the mixer of the corresponding branch.

Figure 9:
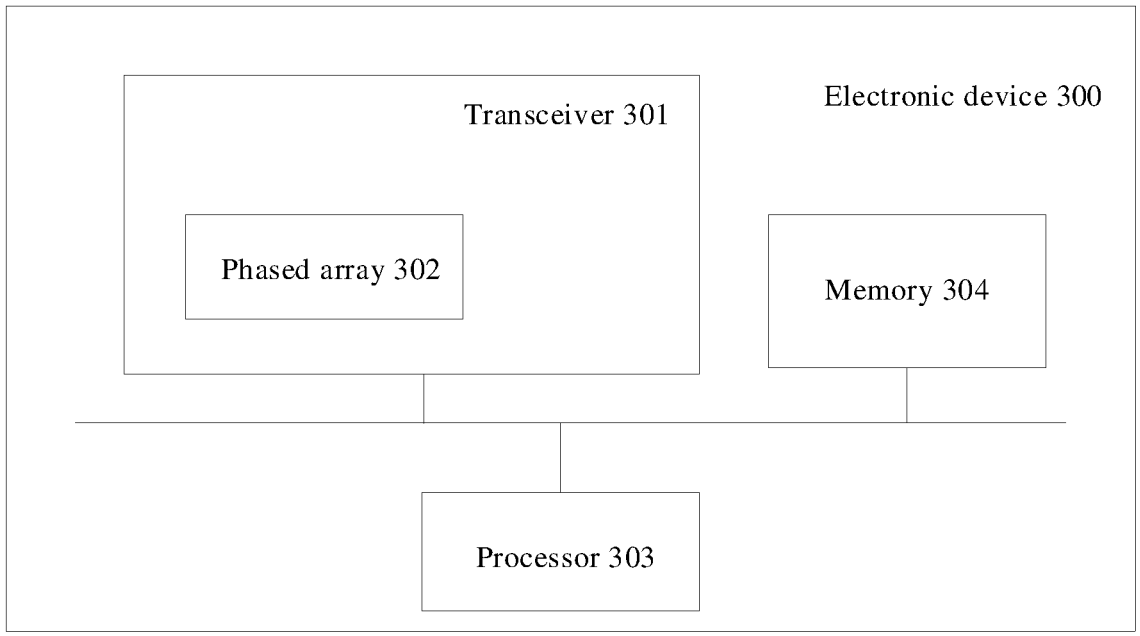
FIG. 9 is a schematic diagram of an electronic device according to an embodiment of this application.

An embodiment of this application further provides an electronic device 300. Refer to FIG. 9. The electronic device 300 may include a transceiver 301, a memory 304, and a processor 303. The foregoing phased array 302 is disposed in the transceiver 301.

Figure 10:
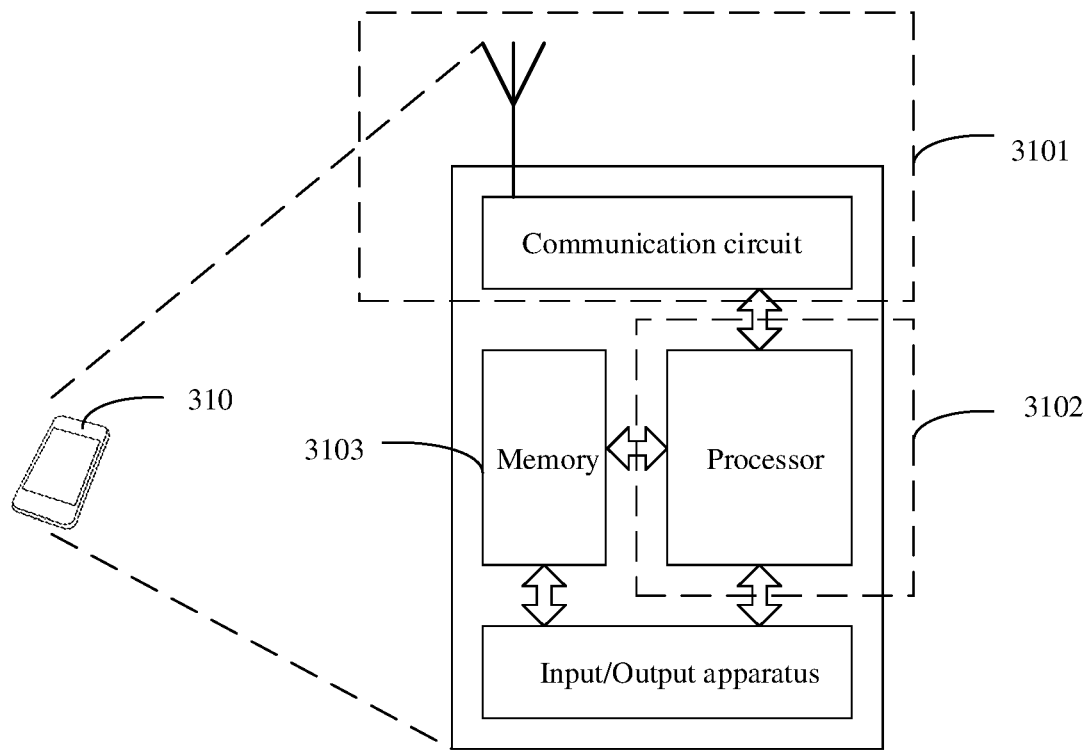
FIG. 10 is a schematic diagram of a smartphone according to an embodiment of this application.

It should be understood that the electronic device 300 herein may be specifically a terminal device such as a smartphone, a computer, or a smart watch. A smartphone 310 shown in FIG. 10 is used as an example of the terminal device. The smartphone may specifically include a processor 3102, a memory 3103, a communication circuit, an antenna, and an input/output apparatus. The processor 3102 is mainly configured to process a communication protocol and communication data, control the entire smartphone, execute a software program, and process data of the software program, for example, configured to support the smartphone 310 in performing actions described in the foregoing method embodiments. The memory 3103 is mainly configured to store the software program and data. The communication circuit is mainly configured to perform conversion between a baseband signal and a radio frequency signal and processing of the radio frequency signal. The communication circuit includes the foregoing phased array. The communication circuit is mainly configured to receive and transmit a radio frequency signal in a form of an electromagnetic wave. The input/output apparatus is, for example, a touchscreen, a display, or a keyboard, and is mainly configured to receive data entered by a user and output data to the user.

After the smartphone 310 is powered on, the processor 3102 may read the software program in the memory 3103, interpret and execute instructions of the software program, and process the data of the software program. When data needs to be sent wirelessly, the processor 3102 performs baseband processing on the data to be sent, and then outputs a baseband signal to a radio frequency circuit. The radio frequency circuit performs radio frequency processing on the baseband signal, and then sends out a radio frequency signal through the antenna in a form of an electromagnetic wave. When data is sent to the smartphone 310, the radio frequency circuit receives a radio frequency signal through the antenna, converts the radio frequency signal into a baseband signal, and outputs the baseband signal to the processor 3102. The processor 3102 converts the baseband signal into data, and processes the data.

A person skilled in the art may understand that, for ease of description, FIG. 10 shows only one memory and one processor. In an actual terminal device, there may be a plurality of processors and a plurality of memories. The memory may also be referred to as a storage medium, a storage device, or the like. It should be noted that a type of the memory is not limited in embodiments of this application.

It should be understood that an Xth band mentioned in this application, for example, the first band, the second band, the third band, and the fourth band, is a fixed frequency range defined by a standardization organization or commercially used, and includes but is not limited to the millimeter wave band of 5G defined by 3GPP in embodiments of this application that includes n257 (26.5 GHz to 29.500 GHz), n260 (37 GHz to 40 GHz), n258 (24.25 GHz to 27.5 GHz), and n261 (27.5 GHz to 28.35 GHz).

It should be understood that a signal in an Xth band mentioned in this application, for example, a signal in the first band, a signal in the second band, a signal in the third band, or a signal in the fourth band, is a signal transmitted in the Xth band. The signal may be a signal transmitted using an entire bandwidth or a partial bandwidth in the Xth band.

It should be understood that sequence numbers of the foregoing processes do not mean execution sequences in this application. The execution sequences of the processes should be determined according to functions and internal logic of the processes, and should not be construed as any limitation on the implementation processes of embodiments of this application. The term "coupled" mentioned in this application is used for indicating interworking or interaction between different components, and may include a direct connection or an indirect connection via another component. For example, that a XX end is coupled to ground indicates that the XX end may be directly coupled to ground, or may be coupled to ground via another component.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A multi-band phased array, comprising:
a plurality of branches coupled to a plurality of multi-band antennas, wherein each of the plurality of branches comprises a multi-band low noise amplifier configured to receive an inter-band carrier aggregation signal, the inter-band carrier aggregation signal comprises a first carrier signal located in a first band and a second carrier signal located in a second band, and the first band is different from and does not overlap the second band;
wherein the multi-band low noise amplifier of each of the plurality of branches comprises an input end, a first input matching network, a second input matching network, a first amplifier, and a second amplifier, the input end is coupled to the multi-band antenna and is configured to receive the inter-band carrier aggregation signal, the first input matching network is coupled between the input end and the first amplifier, and is configured to implement impedance matching for the first carrier signal to generate a matched first carrier signal, the first amplifier is configured to amplify the matched first carrier signal, the second input matching network is coupled between the input end and the second amplifier, and is configured to implement impedance matching for the second carrier signal to generate a matched second carrier signal, and the second amplifier is configured to amplify the matched second carrier signal; and
wherein each of the plurality of branches further comprises a phase shifter configured to perform phase shifting on the first carrier signal output by an output end of the first amplifier and configured to perform phase shifting on the second carrier signal output by an output end of the second amplifier.

2. The multi-band phased array according to claim 1, wherein
the first input matching network of the multi-band low noise amplifier of each of the plurality of branches is further configured to suppress transmission of the second carrier signal; and
the second input matching network of the multi-band low noise amplifier of each of the plurality of branches is further configured to suppress transmission of the first carrier signal.

3. The multi-band phased array according to claim 1, wherein
a center frequency of the first band is lower than a center frequency of the second band;
the first input matching network of the multi-band low noise amplifier of each of the plurality of branches comprises a first inductor coupled in series between an input end of the first input matching network and an output end of the first input matching network; and
the second input matching network of the multi-band low noise amplifier of each of the plurality of branches comprises a transformer coupled between an input end of the second input matching network and an output end of the second input matching network, the transformer comprises a primary coil and a secondary coil, a first end of the primary coil is coupled to the input end of the second input matching network, and a second end of the primary coil is coupled to ground; and a first end of the secondary coil is coupled to the output end of the second input matching network, and a second end of the secondary coil is coupled to ground.

4. The multi-band phased array according to claim 3, wherein
the first input matching network of the multi-band low noise amplifier of each of the plurality of branches further comprises a switch, wherein the switch is coupled between a signal path in the first input matching network and a ground end.

5. The multi-band phased array according to claim 1, wherein
the multi-band low noise amplifier of each of the plurality of branches further comprises a second inductor, wherein a first end of the second inductor is coupled to the input end of the multi-band low noise amplifier, and a second end of the second inductor is coupled to ground.

6. The multi-band phased array according to claim 1, wherein
the first amplifier of the multi-band low noise amplifier of each of the plurality of branches comprises a first source degeneration inductor;
the second amplifier of the multi-band low noise amplifier of each of the plurality of branches comprises a second source degeneration inductor; and
an inductance value of the first source degeneration inductor is greater than that of the second source degeneration inductor.

7. The multi-band phased array according to claim 1, wherein
the phase shifter of the multi-band low noise amplifier of each of the plurality of branches comprises a first phase shift branch and a second phase shift branch;
the first phase shift branch is coupled to the output end of the first amplifier, and is configured to perform phase shifting on the first carrier signal; and
the second phase shift branch is coupled to the output end of the second amplifier, and is configured to perform phase shifting on the second carrier signal.

8. The multi-band phased array according to claim 7, wherein
the first phase shift branch comprises a first mixer and a first phase shifter;
the second phase shift branch comprises a second mixer and a second phase shifter;
the first phase shifter is coupled between the first mixer and a local oscillator signal generator; and
the second phase shifter is coupled between the second mixer and the local oscillator signal generator.

9. The multi-band phased array according to claim 8, wherein
the local oscillator signal generator comprises a first local oscillator signal generator and a second local oscillator signal generator;
the first phase shifter is coupled between the first local oscillator signal generator and the first mixer; and
the second phase shifter is coupled between the second local oscillator signal generator and the second mixer.

10. The multi-band phased array according to claim 8, wherein
the first phase shift branch comprises a third phase shifter coupled between the first mixer and an intermediate frequency signal processor, the third phase shifter is configured to perform phase shifting on a down-converted intermediate frequency signal in the first phase shift branch;

the second phase shift branch comprises a fourth phase shifter coupled between the second mixer and the intermediate frequency signal processor, the fourth phase shifter is configured to perform phase shifting on a down-converted intermediate frequency signal in the second phase shift branch; and the intermediate frequency signal processor is configured to perform filtering and analog-to-digital conversion on a phase-shifted intermediate frequency signal.

11. The multi-band phased array according to claim 1, wherein the first band covers n257, n258, and n261; and the second band covers n259 and n260.

12. An electronic device, comprising:

a transceiver; and a processor coupled to the transceiver, wherein the transceiver comprises a multi-band phased array, comprising:

a plurality of branches coupled to a plurality of multi-band antennas, wherein each of the plurality of branches comprises a multi-band low noise amplifier configured to receive an inter-band carrier aggregation signal, the inter-band carrier aggregation signal comprises a first carrier signal located in a first band and a second carrier signal located in a second band, and the first band is different from and does not overlap the second band;

wherein the multi-band low noise amplifier of each of the plurality of branches comprises an input end, a first input matching network, a second input matching network, a first amplifier, and a second amplifier, the input end is coupled to the multi-band antenna and is configured to receive the inter-band carrier aggregation signal, the first input matching network is coupled between the input end and the first amplifier, and is configured to implement impedance matching for the first carrier signal to generate a matched first carrier signal, the first amplifier is configured to amplify the matched first carrier signal, the second input matching network is coupled between the input end and the second amplifier, and is configured to implement impedance matching for the second carrier signal to generate a matched second carrier signal, and the second amplifier is configured to amplify the matched second carrier signal; and wherein each of the plurality of branches further comprises a phase shifter configured to perform phase shifting on the first carrier signal output by an output end of the first amplifier and configured to perform phase shifting on the second carrier signal output by an output end of the second amplifier.

13. The electronic device according to claim 12, wherein the first input matching network of the multi-band low noise amplifier of each of the plurality of branches is further configured to suppress transmission of the second carrier signal; and the second input matching network of the multi-band low noise amplifier of each of the plurality of branches is further configured to suppress transmission of the first carrier signal.

14. The electronic device according to claim 12, wherein a center frequency of the first band is lower than a center frequency of the second band;

the first input matching network of the multi-band low noise amplifier of each of the plurality of branches comprises a first inductor; the first inductor is coupled in series between an input end of the first input matching network and an output end of the first input matching network; and the second input matching network of the multi-band low noise amplifier of each of the plurality of branches comprises a transformer coupled between an input end of the second input matching network and an output end of the second input matching network, the transformer comprises a primary coil and a secondary coil, a first end of the primary coil is coupled to the input end of the second input matching network, a second end of the primary coil is coupled to ground, a first end of the secondary coil is coupled to the output end of the second input matching network, and a second end of the secondary coil is coupled to ground.

15. The electronic device according to claim 14, wherein the first input matching network of the multi-band low noise amplifier of each of the plurality of branches further comprises a switch, wherein the switch is coupled between a signal path in the first input matching network and a ground end.

16. The electronic device according to claim 12, wherein the multi-band low noise amplifier of each of the plurality of branches further comprises a second inductor, wherein a first end of the second inductor is coupled to the input end of the multi-band low noise amplifier, and a second end of the second inductor is coupled to ground.

17. The electronic device according to claim 12, wherein the first amplifier of the multi-band low noise amplifier of each of the plurality of branches comprises a first source degeneration inductor;

the second amplifier of the multi-band low noise amplifier of each of the plurality of branches comprises a second source degeneration inductor; and an inductance value of the first source degeneration inductor is greater than that of the second source degeneration inductor.

18. The electronic device according to claim 12, wherein the phase shifter of the multi-band low noise amplifier of each of the plurality of branches comprises a first phase shift branch and a second phase shift branch;

the first phase shift branch is coupled to the output end of the first amplifier, and is configured to perform phase shifting on the first carrier signal; and the second phase shift branch is coupled to the output end of the second amplifier, and is configured to perform phase shifting on the second carrier signal.

19. The electronic device according to claim 18, wherein the first phase shift branch comprises a first mixer and a first phase shifter;

the second phase shift branch comprises a second mixer and a second phase shifter;

the first phase shifter is coupled between the first mixer and a local oscillator signal generator; and the second phase shifter is coupled between the second mixer and the local oscillator signal generator.

20. The electronic device according to claim 12, wherein the first band covers n257, n258, and n261; and the second band covers n259 and n260.

* * * * *